(12) United States Patent
Huang et al.

(10) Patent No.: US 8,895,980 B2
(45) Date of Patent: Nov. 25, 2014

(54) TUNNELING CURRENT AMPLIFICATION TRANSISTOR

(75) Inventors: Ru Huang, Beijing (CN); Zhan Zhan, Beijing (CN); Qianqian Huang, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 529 days.

(21) Appl. No.: 13/255,087

(22) PCT Filed: May 26, 2011

(86) PCT No.: PCT/CN2011/074686
§ 371 (c)(1), (2), (4) Date: Sep. 6, 2011

(87) PCT Pub. No.: WO2012/142781
PCT Pub. Date: Oct. 26, 2012

(65) Prior Publication Data
US 2012/0267700 A1 Oct. 25, 2012

(30) Foreign Application Priority Data

Apr. 20, 2011 (CN) .......................... 2011 1 0098730

(51) Int. Cl.
*H01L 29/73* (2006.01)
*H01L 29/739* (2006.01)
*H01L 29/00* (2006.01)

(52) U.S. Cl.
CPC .................................. *H01L 29/7391* (2013.01)
USPC ............. 257/47; 257/205; 257/272; 257/423; 257/E29.179; 257/499

(58) Field of Classification Search
CPC ...................... H01L 29/66931; H01L 29/7311; H01L 27/067; H01L 27/0783; H01L 27/075
USPC ........... 257/47, 197, 205, 272, 273, 368, 378, 257/423, 499, 511, 517, 525, 526, 556, 557, 257/565, 575, E25.015, E27.023, 30, 257/E29.179, E21.395
See application file for complete search history.

(56) References Cited

U.S. PATENT DOCUMENTS 5,326,710 A * 7/1994 Joyce et al. .................... 438/203
5,898,613 A * 4/1999 Diorio et al. ............. 365/185.03

(Continued)

OTHER PUBLICATIONS

Wang et al. Complementary tunneling transistor for low pwoer applications. Solid-State Electronics 48 (2004), pp. 2281-2286.*

(Continued)

*Primary Examiner* — Galina Yushina
(74) *Attorney, Agent, or Firm* — Maschoff Brennan

(57) ABSTRACT

The present invention discloses a tunneling current amplification transistor, which relates to an area of field effect transistor logic devices in CMOS ultra large scale semiconductor integrated circuits (ULSI). The tunneling current amplification transistor includes a semiconductor substrate, a gate dielectric layer, an emitter, a drain, a floating tunneling base and a control gate, wherein the drain, the floating tunneling base and the control gate forms a conventional TFET structure, and a doping type of the emitter is opposite to that of the floating tunneling base. A position of the emitter is at the other side of the floating tunneling base with respect to the drain. A type of the semiconductor between the emitter and the floating tunneling base is the same as that of the floating tunneling base. As compared with the conventional TFET, the tunneling current amplification transistor of the present invention can increase the on-current of the device effectively and increase the driving capability of the device.

4 Claims, 3 Drawing Sheets

(56) References Cited

U.S. PATENT DOCUMENTS

| | | |
|---|---|---|
| 6,246,103 B1 | 6/2001 | Yu |
| 6,249,031 B1 * | 6/2001 | Verma et al. .................. 257/378 |
| 2006/0008960 A1 | 1/2006 | Chaudhry |
| 2008/0175050 A1 | 7/2008 | Pesavento et al. |

OTHER PUBLICATIONS

Sze, Semiconductor Devices, Physics and Technology, 2nd Edition, pp. 131-132.*

* cited by examiner

TUNNELING CURRENT AMPLIFICATION TRANSISTOR

FIELD OF THE INVENTION

The present invention refers to an area of field effect transistor logic devices in CMOS ultra large scale semiconductor integrated circuits (ULSI), particularly, refers to a field effect transistor which amplifies a band-to-band tunneling current by using a PN junction, that is, refers to a tunneling current amplification transistor.

BACKGROUND OF THE INVENTION

The development of integrated circuits in over 50 years can be described by Moore's Law. The driving force to the future integrated circuit industry and the system development shall be reduction of power consumption, that is, the technology node is not to increase the integration degree, but to take the increase of the performance-to-power-consumption ratio as a goal. As the power consumption of integrated circuits becomes an unneglectable problem, a "green" nanoscale device aimed at low power consumption design emerges. The theoretical limit of a subthreshold slope of a conventional MOSFET is 60 mV/dec due to the limitation of thermoelectric force. As the device size decreases, the threshold voltage of the device decreases and a static leakage current of the device deteriorates inevitably, leading to an increase of the static power consumption and thus the requirement of low power consumption design in the future can not be satisfied. A TFET (Tunneling FET) controls the position of the channel energy band by using a gate electrode, and an on-current is provided to the TFET by using a band-to-band tunneling. Such a carrier generation mechanism, which is different from that of the MOSFET, overcomes a restriction to the subthreshold characteristic due to the Fermi distribution of the carriers in the source end, and it can further reduce the subthreshold slope of the device, reduce the static leakage current of the device, and hence reduce the static power consumption of the device. However, due to a tunneling barrier, a low tunneling efficiency is always a problem that is difficult to be solved. Although the application of a narrow-forbidden-band semiconductor overcomes the problem regarding to the magnitude of the tunneling current, a resulting leakage current and an increase of the cost resulting from the new material become the barriers to its massive application.

SUMMARY OF THE INVENTION

An object of the invention is to provide a tunneling current amplification transistor, which has the advantages of low leakage current, steep subthreshold slope and high on-current and so on.

A tunneling current amplification transistor provided by the invention includes a semiconductor substrate, a gate dielectric layer, an emitter, a drain, a floating tunneling base and a control gate, wherein the drain, the floating tunneling base and the control gate form a conventional TFET structure, and a doping type of the emitter is opposite to that of the floating tunneling base. Accordingly, the emitter may provide another type of carrier to amplify the current of the floating tunneling base.

A position of the emitter is generally at the other side of the floating tunneling base with respect to the drain. Generally, a type of the semiconductor between the emitter and the floating tunneling base shall be the same as that of the floating tunneling base. This can be achieved by selecting a suitable type of the semiconductor substrate, and can be achieved by a well injection, with a doping concentration generally no more than $1e19$ $cm^{-3}$.

The floating tunneling base is generally heavily doped in order to provide a high tunneling efficiency. The emitter is also heavily doped in order to provide a high current amplification capability.

A material of the gate dielectric layer is silicon dioxide or other insulation material.

The present invention may be applied on silicon-based semiconductor materials, and may be applied on other semiconductor materials, such as germanium, gallium arsenide, and indium phosphide. Moreover, heterojunction may also be formed by adopting other semiconductor materials in a certain portion of the device.

The tunneling current amplification transistor according to the present invention amplifies the band-to-band tunneling current by a PN junction. Taking an N-type device as an example, as the gate voltage increases, an electric field between the floating tunneling base and the channel increases. Under the strong field, electrons in the valence band of the floating tunneling base starts to tunnel towards the conduction band of the channel. Such a tunneling process injects a hole current into the floating tunneling base, and at the same time, injects an electron current into the channel. When the tunneling current is small, the hole current injected into the floating tunneling base is recombined in the emitter so that the hole current is converted into an electron current again. When the tunneling current is large, the hole current injected into the floating tunneling base may introduce an electron current with a certain magnification factor. The magnification factor is approximately equal to a ratio of the doping concentrations at two ends of the emitter. The introduced electron current may drift to the drain so as to be collected by the drain, and thereby the magnitude of the on-current is increased. When the gate voltage return to zero, the tunneling current is suppressed, and thus the hole current injected into the floating tunneling base is cut off, so that the device instantly enters into an off-state.

As compared with the conventional TFET, the tunneling current amplification transistor of the present invention can effectively increase the on-current of the device and increase the driving capability of the device.

BRIEF DESCRIPTION OF THE DRAWINGS

FIGS. 2a-2f are the primary process steps for fabricating the tunneling current amplification transistor of the present invention, wherein:

FIG. 2a illustrates a process of a well injection and a well thermal diffusion

FIG. 2b illustrates a process of an injection of an emitter and a drain;

FIG. 2c illustrates a process of forming an injection window for a floating tunneling base by photolithography;

FIG. 2d illustrates an etching of a polysilicon and an injection of the floating tunneling base;

FIG. 2e illustrates a procedure of junction activation;

FIG. 2f is a schematic structure diagram of a resultant tunneling current amplification transistor.

In the figures, 1—a polysilicon gate; 2—a gate oxide layer; 3—a floating tunneling base; 4—an emitter; 5—a semiconductor substrate; 6—a well; 7—a drain; 8—a silicon dioxide layer; 9—metal contact electrodes; 10—a photoresist.

DETAILED DESCRIPTION OF THE EMBODIMENTS

The implementation of a tunneling current amplification transistor of the invention will be further described below by specific embodiments and in combination with the accompany drawings.

The specific implementation steps are as shown in FIGS. 2*a*-2*f*.

Figure 1:
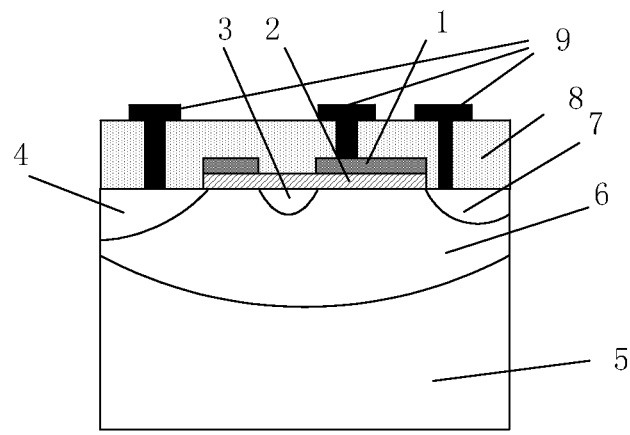
FIG. 1 is a schematic structure diagram of a tunneling current amplification transistor provided by the invention.
Figure 2A:
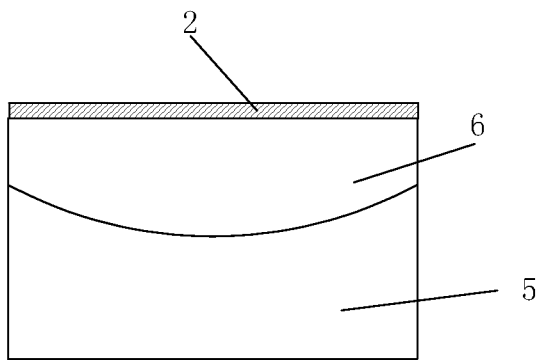

1. A gate oxide layer (i.e., a gate dielectric layer) 2 is growed on a semiconductor substrate 5. A silicon nitride is deposited, and a photolithography is performed on the active region. Then, a well implantation is performed and subsequently a well thermal diffusion is performed to form a well 6, as shown in FIG. 2*a* (the purpose of forming the well is to provide a required semiconductor material between an emitter and a floating tunneling base. However, if the semiconductor substrate itself meets the requirement, the process step of the well injection may be omitted).

Figure 2B:
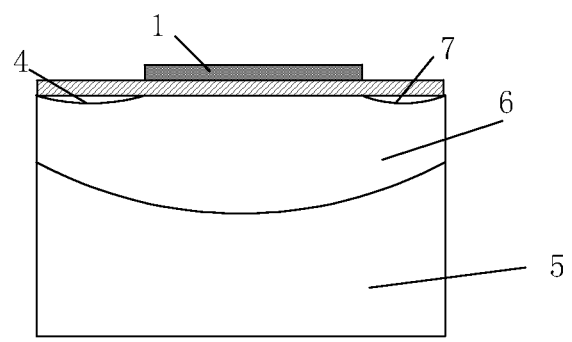

2. A polysilicon is deposited. An injection to the polysilicon is performed. Then, the polysilicon is subjected to a photolithography and an etching so as to form an injection window for the emitter and the drain. The emitter 4 and drain 7 is subjected to injection by using the polysilicon gate 1 as a hard mask, as shown in FIG. 2*b*.

Figure 2C:
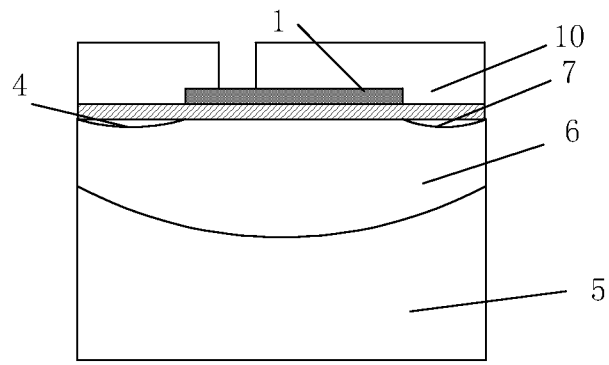

3. A photoresist 10 is coated. Then, an injection window for the floating tunneling base is formed by photolithography, as shown in FIG. 2*c*.

Figure 2D:
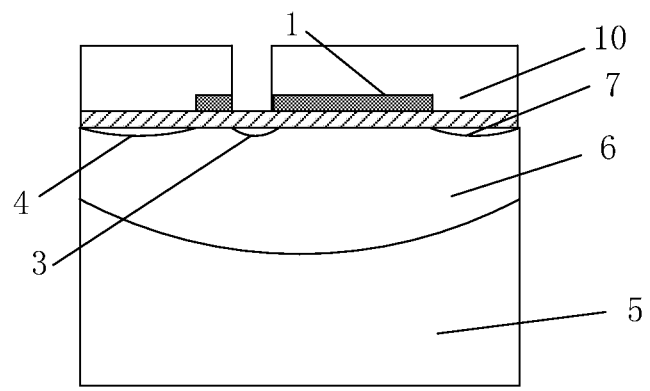

4. The polysilicon gate 1 is etched. Then, an injection for the floating tunneling base 3 is performed, as shown in FIG. 2*d*.

Figure 2E:
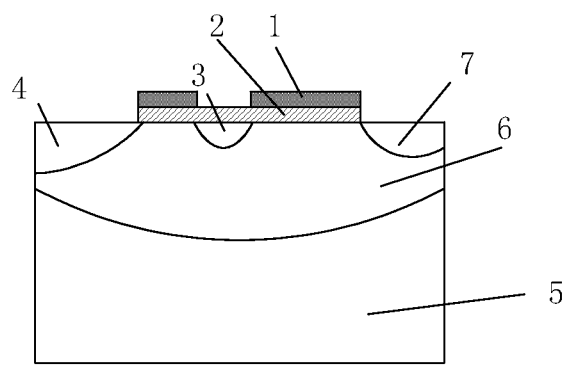

5. The photoresist is removed. Then, impurities doped into the emitter 4, the drain 7 and the floating tunneling base 3 are activated at a high temperature, as shown in FIG. 2*e*.

Figure 2F:
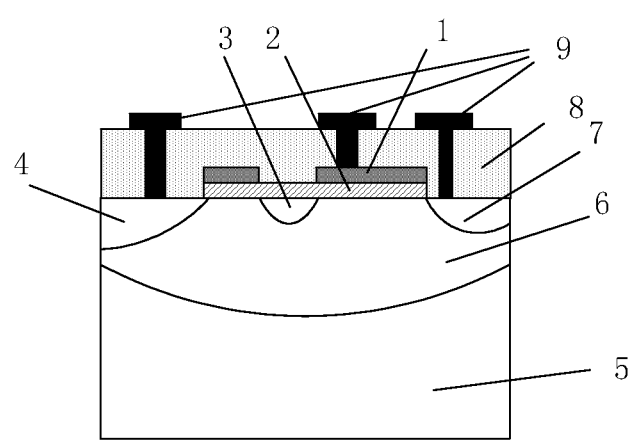

6. A silicon dioxide layer 8 is deposited on the entire surface. Contact holes are formed by photolithography. Then, a metal is sputtered. Subsequently, electrodes 9 for the emitter, the drain and the gate contact are formed by photolithography and etching. Finally, the tunneling current amplification transistor is formed, as shown in FIG. 2*f*.

Although preferable embodiments of the present invention have been described above, they are not intended to limit the invention. It will be understood by one skilled in the art that various changes and modifications or equivalent embodiments can be made to the above-mentioned methods and technical contents. Any changes and modifications or equivalent embodiments according to the technical spirits of the invention without departing from the scope of the technical contents will fall into the claims.

What is claimed is:

1. A tunneling current amplification transistor, characterized in that, the transistor comprises: a semiconductor substrate, a gate dielectric layer, an emitter, a drain, a floating tunneling base and a control gate, wherein the drain, the floating tunneling base and the control gate form a TFET (Tunnel Field Effect Transistor) structure, wherein a position of the emitter is at the other side of the floating tunneling base with respect to that of the drain, a doping type of the emitter is opposite to that of the floating tunneling base, and wherein the floating tunneling base is in direct contact with the gate dielectric layer and separated from the drain.

2. The tunneling current amplification transistor according to claim 1, characterized in that, a doping type of a semiconductor between the emitter and the floating tunneling base is the same as that of the floating tunneling base, and oa doping concentration of the semiconductor between the emitter and the floating tunneling base is no more than 1e19 $cm^{-3}$.

3. The tunneling current amplification transistor according to claim 1, characterized in that, the device is implemented by using a silicon-based semiconductor material, a germanium-based semiconductor material, a gallium-arsenide-based semiconductor material, or an indium-phosphide-based semiconductor material.

4. The tunneling current amplification transistor according to claim 1, characterized in that, silicon dioxide is adopted for the gate dielectric layer.

\* \* \* \* \*